United States Patent [19]

Fredberg

[11] Patent Number: 5,547,386

[45] Date of Patent: Aug. 20, 1996

[54] APPARATUS ADAPTED FOR COACTION WITH A NUMBER OF CIRCUIT BOARDS

[75] Inventor: Sven T. Fredberg, Skarpnäck, Sweden

[73] Assignee: Telefonaktiebolaget L M Ericsson, Stockholm, Sweden

[21] Appl. No.: 306,574

[22] Filed: Sep. 15, 1994

[30] Foreign Application Priority Data

Sep. 23, 1993 [SE] Sweden .................................. 9303105

[51] Int. Cl.⁶ ....................................................... H05K 7/14
[52] U.S. Cl. ............................................... 439/61; 439/65
[58] Field of Search ........................................ 439/65, 61

[56] References Cited

U.S. PATENT DOCUMENTS

| | | | |
|---|---|---|---|
| 4,420,793 | 12/1983 | Strandberg | 439/61 |
| 4,511,950 | 4/1985 | Bunner et al. | |
| 4,998,180 | 3/1991 | McAuliffe et al. | 361/684 |
| 5,006,961 | 4/1991 | Monico . | |

FOREIGN PATENT DOCUMENTS

| | | |
|---|---|---|
| 226765 | 7/1987 | European Pat. Off. . |
| 302351 | 2/1989 | European Pat. Off. . |
| 488057 | 6/1992 | European Pat. Off. . |

*Primary Examiner*—P. Austin Bradley
*Assistant Examiner*—T. C. Patel
*Attorney, Agent, or Firm*—Burns, Doane, Swecker & Mathis, L.L.P.

[57] ABSTRACT

An apparatus having a backplane adapted for coaction with a number of circuit boards arranged in side-by-side relationship and including a number of mutually adjacent and mutually spaced elongated, narrow backplane-related connector fields, each of which is adapted for firm but easily removed mechanical and electrical coaction with a corresponding connector field related to an edge-part of respective circuit boards. A number of first selected backplane-related connector fields are connected electrically to a first bus, and a number of second selected backplane related connector fields are connected electrically to a second bus. The backplane-related connector fields are divided into a predetermined number of groups wherein each group is allotted a part-section of the backplane and wherein the first connector fields of respective groups are joined together and connect to the first bus. Each backplane-related group is allocated the same number of connector fields and each second connector field of each group are mutually joined and connect to the second bus.

10 Claims, 2 Drawing Sheets

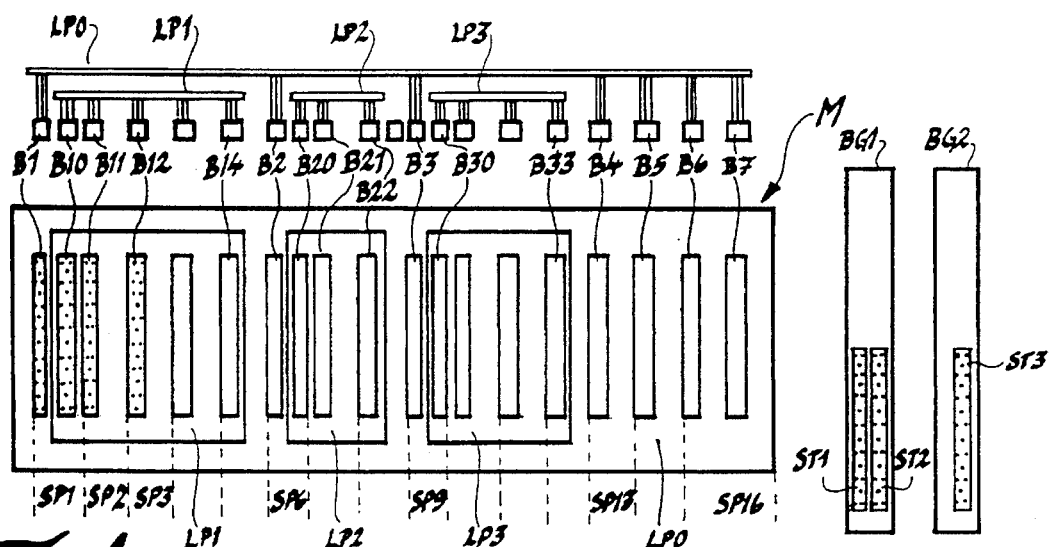
Fig. 1. PRIOR ART
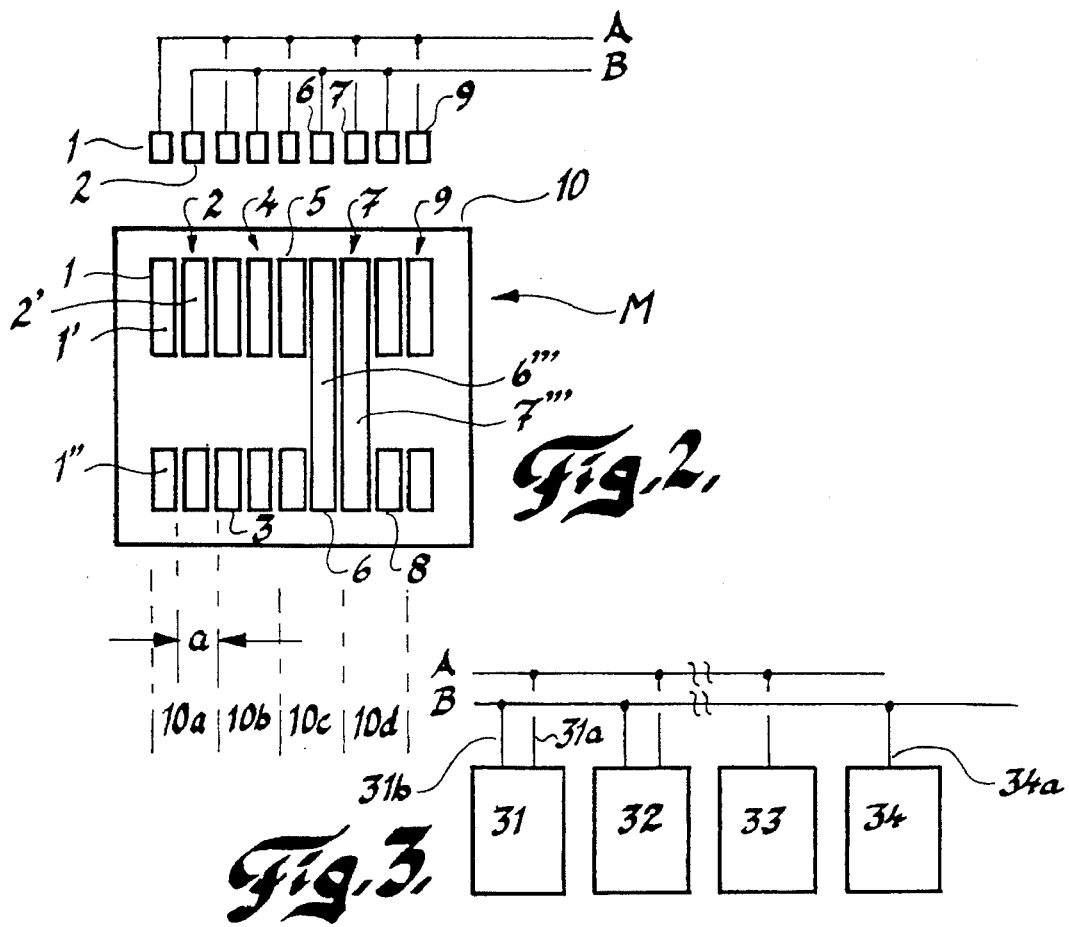
Fig. 2.
Fig. 3.

APPARATUS ADAPTED FOR COACTION WITH A NUMBER OF CIRCUIT BOARDS

BACKGROUND

The present invention relates to an apparatus which is adapted particularly for use with electronic equipment, wherein the apparatus is constructed so as to enable a plurality of circuit boards disposed side-by-side to be firmly held in the apparatus but readily removable therefrom, said apparatus being referred to generally as a magazine.

Magazines of this kind may comprise a backplane on which there has been mounted rows of connector fields or connector strips in predetermined spaced relationship in grooves provided in a lower part and an upper part of the backplane for guiding the circuit boards towards and away from said connector strips, and may further comprise two end walls, wherein the connectors belonging to the connector strips of the backplane and the connectors belonging to the connector strips on the circuit boards can be brought into and out of coaction with one another.

The backplane is in the form of a board which carries a printed circuit where the circuit is normally oriented in several planes and coordinated for coaction with individual electrical connectors provided in the electrical connector strips belonging to the backplane.

The individual connectors in such a connector strip may be connected through the printed circuit on the backplane, or mother board, to other connectors included in another or in several other connector strips to form a bus therebetween, and hence the backplane may also be referred to as a backplane bus.

It can be mentioned at this point that such buses may be referred to as data buses in the transmission of data information, as address buses in the transmission of address information, and so on. The invention includes every type of signal information transmitting bus.

Furthermore, by "bus" as used in the following description is meant that all signal information that occurs thereon shall be available to a plurality of identical or different signal processing units or the like belonging to one or more circuit boards.

Magazines of the kind intended here are normally standardized, having specific breadth and height measurements with regard to the backplane and specific measurements, depth measurements, for usable boards, and having specific distances or spacings between respective boards and therewith between mutually adjacent connector strips in the backplane.

Normally, there is chosen a magazine size which will provide adequate accommodation for the required number of circuit boards and which will subsequently enable a simple extension to be achieved.

The magazine is thus used to position the necessary circuit boards in side-by-side relationship, where each circuit board may carry data processing units, adaptation circuits, memory stores and the like, coordinated to perform a number of functions.

In one application, it may be convenient to coordinate data processing and the central unit on one board, the requisite memory stores on another board, and input ports and output ports on a further board.

In addition to this coordination, the possibility is also afforded of permitting the backplane of the magazine to include one or more buses, such as to enable the functions of one circuit board to coact with the functions of one or more other circuit boards allocated to the own, or local, magazine or to some other magazine.

The invention also relates to a development of the type of magazine that includes a measurement-standardized backplane on which there is mounted a predetermined number of mutually adjacent and mutually spaced elongated, narrow connector fields in the form of connector strips, each of which carries, in rows and columns, connectors in the form of pin connectors (or socket connectors) and are each adapted for firm, but easily released, mechanical and electrical coaction with a corresponding connector field in the form of connector strips which carry rows and columns of connectors in the form of socket connectors (or pin connectors) related to and attached to an edge part of respective circuit boards.

It is known in the case of such magazines to permit part of a number of selected first connector fields to be connected electrically to a first bus, and to permit a part of a number of selected second connector fields to be connected electrically to a second bus.

Several different designs of apparatus and magazines which include a backplane, or mother board, provided with connector fields or connector strips of the aforedescribed kind are known in principle to the art.

Reference can be made in this regard to the electronic apparatus or the magazine illustrated and described in European Patent Application 88111974.7, Publication No. 0,302, 351. (See FIG. 1).

In the following description of the earlier known prior art bracketed reference signs have been included by way of reference to corresponding parts in the aforesaid patent publication, where a Figure included in this reference corresponds to FIG. 1 of the instant Patent Application.

The electronic apparatus illustrated and described in the aforesaid European patent publication includes a carrier (a backplane) which supports a number of printed circuit boards, this card carrier including a plurality of contact sites or connector fields (SP1, SP2 . . . SP16), in which different circuit boards (BG1, BG2) can be inserted.

The connector fields with backplane connectors are divided into at least two groups (B1, B2 . . . B7; B10, B11, B12, B13, B14; B20, B21, B22; B30 . . . B33).

The groups of connector fields (B1, B2 . . . B7; B10, B11, B12, B13, B14; B20, B21, B22; B30 . . . B33) are mutually cross-connected by means of cross-connections or buses (LP0, LP1, LP2, LP3).

Corresponding connector fields (ST1, ST2, ST3) having corresponding connectors are attached to one edge of a respective circuit board (BG1, BG2), this edge being positioned at right angles to the insertion direction. When respective circuit boards are inserted to their respective positions, these connectors are electrically connected with selected connector fields and their backplane connectors, and therewith form an electrical connection between circuit board and backplane.

The connector sites or connector fields in the backplane (SP1, SP2, . . . SP16) are primarily intended for two different circuit boards. A first connector field (SP1) coordinated in two rows of connectors, is adapted for coaction with a first circuit board (BG1) having two rows of connector fields (ST1, ST2), a second connector field (SP2) and several thereof are adapted for coaction with a second circuit board (BG2) having a row of connectors (ST3).

The first circuit board (BG1) thus includes two rows of connector fields (ST1 and ST2) and is adapted for coaction with certain selected connector fields in the backplane (B1, B10; B2, B20; B3, B30) and is therewith connected to two buses (LP0 and LP1; LP0 and LP2, LP0 and LP3).

The second circuit board (BG2) includes only one row of connector fields (ST3) and is therewith primarily adapted for coaction solely with certain connector fields (B11, B12; B21, B22) in the backplane for connection to one bus (LP1, LP2).

The aforesaid patent publication also discloses the connection between various circuit boards and the backplane connector fields with the bus connection. In order to function, it is necessary when using one circuit board (BG2) which includes one single coupling field (ST3) having connectors, for said coupling field (ST3) to be always mounted in one first coupling field among several possible coupling fields on the backplane, while when using the second circuit board (BG1) having two coupling fields (ST1, ST2) with connectors, it is necessary always to mount the fields in both a first and a second coupling field.

When considering the features characteristic of the present invention, it can be established that the connector fields, and therewith the circuit board sites, are here coordinated in groups in part-sections of the backplane.

In a left side part-section (B1, B10–B14), The first connector field (B1) is connected to respective first connector fields (B2, B3) for mutually adjacent part-sections (B2, B20–B22; B3, B30–B33).

Remaining connector fields (B10–B14) within respective part-sections (B1; B10–B14) are connected together and connect with a common bus (LP1).

Thus, according to the technique known from this publication, one connector field of the parallel backplane connector fields begins by being adapted for one single bus (B1, LP0), while a plurality of connector fields (SP2, SP3, SP4, SP5) oriented laterally of this one connector field coact with one single second bus (LP1).

Furthermore, it can be seen that when dividing the backplane into the aforesaid part-sections (SP1–SP5, SP6–SP8, SP9–SP12), each first connector field (B1, B2, B3) will connect to one and the same bus (LP0), whereas remaining connector fields (B10, B11, B12, B13, B14) within selected part-sections will all connect to another bus (LP1) allocated to the part-section.

The two adjacent connector fields (B1, B10) of the backplane are intended to be connected to the first bus (LP0) and also to the second bus (LP1) through one single circuit board (BG1).

It will also be seen that the backplane-related connector fields are grouped in three part-sections (B1, B10–B14; B2, B20–22; B3, B30–B33) with a different number of connector fields within each group.

The following publications can be mentioned as further examples of the present standpoint of techniques.

EP-A-0,488,057

U.S. Pat. No. 5,006,961

U.S. Pat. No. 4,998,180

EP-A2-0,266,765

When considering the earlier standpoint of techniques as described above, it will be seen that a problem resides in providing an apparatus or a magazine of the kind mentioned which will enable standardized boards and/or boards of special manufacture to be brought easily into coaction and connection with one or more buses and which will afford a wide choice with regard to the selection of circuit board sites related to the connector fields of the backplane.

Another technical problem is one of realizing the advantages that are afforded by the manufacture of a backplane in which the connector fields are grouped so that a predetermined number of connector fields form a group and so that the number of connector fields is so selected as to form a plurality of groups, and so that each group is allocated the same number of connector fields.

Another technical problem resides in realizing that when the connector fields are grouped thus, the first connector fields of respective each groups shall be joined together and shall be capable of being connected to a first bus, and that the second connector fields of respective each group shall be joined together and shall be capable of being connected to a second bus, and so on when required.

This thus requires the necessary number of bus connections to be distributed symmetrically among a number of groups.

In addition, it will be seen that a technical problem is one of realizing the simplifications that are achieved when adapting the backplane so that one group or a number of groups coacting with one or two buses adapt to the minimum requirement of an anticipated function, but that one or more further groups are prepared within the backplane and within the confines of its measurements so as to enable the functions to be extended, either as a separate function and/or as a redundant function.

In this regard, a technical problem resides in realizing those advantages that are associated with orientating the connector fields within each part-section and the bus orientation belonging to the backplane in a manner such that one section of each first connector field in each group connects to a first bus, and that each second connector field in each group connects to a second bus, and so on when required.

It will also be seen that a technical problem resides in realizing that even if it is possible theoretically to choose a relatively large number of connector fields within each group, the number of connector fields within the groups should, nevertheless, be limited to two or three in the case of a practical application, since this number normally observes the redundancy requirement and similar requirements and provides the largest possible number of groups within a predetermined measurement dimension of the backplane.

A further technical problem resides in the ability to realize the practical simplifications that are afforded when at least a part of the boards used are constructed specifically to present, as a unit, a number of connector fields and a division therebetween which conforms to the number and the division of the connector fields within the group.

It will also be seen that a technical problem is one of realizing the flexibility that is afforded by including two connector fields within each group, one for each bus, thereby enabling a utilized, standardized circuit board within each group to be connected, through its connector field, to one of the two available mutually spaced buses, either with a specifically-constructed circuit board allocated two planes and having two adjacent connector fields therewith affording one of two possible connections to the two buses, so as to obtain a redundant function thereby, for instance.

With regard to apparatus of the aforesaid kind and with regard to affording the aforesaid flexibility, it will be seen that a further technical problem resides in realizing the significance of using as a starting point a measurement-standardized magazine having a measurement-standardized backplane with measurement-accurate connector fields which are spaced apart at a distance which slightly exceeds the breadth of the connector field and to use at least for certain of these connector fields standardized circuit boards which are connectable to a bus, and also to realize the possibilities available when further connector fields are placed between the earlier mentioned standardized connector fields, and that these further connector fields can be connected to one (or more) other buses through the backplane.

Another technical problem resides in realizing the advantages that are associated with such a simple increase in the capacity of the magazine, where this increase in capacity can be readily effected without needing to increase the external dimensions of the magazine, but is able to create a higher degree of use and greater security via a connection to a further bus, while taking into consideration that one such magazine is basically adapted with its backplane for coaction with a number of boards, each being intended for coaction with one single bus.

It will also be seen that a further technical problem is one of realizing that a desired extension of the functions can create conditions for an error interpreting function and/or a redundant function and/or an improvement in transmission capacity.

Another technical problem is one of realizing that this extension can be achieved with the same magazine size and therewith the same size of the backplane used, but with more connector fields packed closer together.

Another technical problem is one of realizing the significance, and also the simplicity, of permitting a number of first selected connector fields to be given odd numbers, and a number of other selected connector fields to be given even numbers in consecutive order allocated to all connector fields when using only two buses, and to join and connect the odd numbered connector fields to a first bus, and to join and connect the even numbered connector fields to a second bus, the pairs of connector fields forming individual groups.

On the basis of the aforesaid technical problems, it will be understood that a technical problem also resides in realizing that conditions for doubling the connector fields can be readily fulfilled by a standardized magazine retailed with standardized circuit boards under the designation "Futurebus +".

It will also be seen that a technical problem resides in realizing the flexibility that will be afforded by the inventive distribution and grouping of the connector fields when using, in a known manner, a circuit board which is constructed of plates disposed in two or more planes with corresponding two or more connector fields coordinated with adjacent edge-parts of said two or more plates, and the corresponding connector fields are adapted for coaction with the connector fields in the backplane for cooperation with a respective bus, and therewith realize that when the connector fields are uniformly spaced, one such circuit board can be caused to coact with all connector fields within a group or with one or more connector fields within adjacent groups.

SUMMARY

The present invention provides a solution to one or more of the aforesaid technical problems and takes as its starting point an apparatus or a magazine which is adapted for cooperation with a number of circuit boards, preferably standardized circuit boards, disposed in side-by-side relationship, with a number of mutually adjacent and mutually spaced elongated, narrow connector fields belonging to a backplane and having the necessary connection devices, adapted for firm but readily removed mechanical and electrical coaction with the connectors of the connector field related to an edge-part of respective circuit boards, wherein a number of selected first backplane-related connector fields are connected electrically to a first bus, and a number of selected, second connector fields are connected electrically to a second bus, wherein the backplane-related connector fields (1–9) are divided into a predetermined number of groups, and wherein the first connector fields of the groups are mutually joined and are connectable to a first bus.

In accordance with the present invention, each group is allocated the same number of connector fields and each connector field allocated a consecutive sequence of numbers within the group is joined with corresponding connector fields allocated a consecutive number sequence within each other group through the medium of a bus, such that each of the first connector fields of respective groups are joined together and connected to a first bus, and each of the second connector fields within respective groups are mutually joined and connected to the second bus, and so on as required.

According to proposed embodiments lying within the scope of the present invention, the number of connector fields in each group is either three or two.

In this latter case, the number of selected first connector fields may be given odd numbers and the number of selected second connector fields can be given even numbers, wherein all the backplane connector fields in a row are allocated a consecutive sequence, and wherein pairs of connector fields are allocated a group membership.

According to proposed embodiments that lie within the scope of the inventive concept, a number of selected first connector fields coact with a bus through the medium of their connectors, the number of second connector fields coact with a second bus through the medium of their connectors, and the number of selected third connector fields coact with a third bus through the medium of their connectors, wherein the buses are so separated in the backplane as to create conditions for either redundant functions, separate functions, or extended facilities.

Furthermore, the number of selected connector fields within one group is given a predetermined spacing or distance, and the distance between the connector fields belonging to and located adjacent to a respective group is preferably equal to said spacing or distance.

The number of selected first connector fields are preferably spaced at a standardized distance apart, therewith providing an interspace which can accommodate a further connector field and a further circuit board.

It is also proposed that a circuit board (in a known manner) is constructed of two or three plane-orientated plates having corresponding connector fields and connectors coordinated with adjacent edge-parts of said two or three plates, and that the corresponding connector fields are adapted for coaction with connector fields belonging to the backplane and assigned to one or two groups.

Those advantages primarily afforded by an inventive arrangement reside in the creation of conditions whereby, with the aid of particular division and grouping of the backplane connector fields and particular group-wise related coaction between the connector fields via buses, the circuit board capacity of an apparatus for a magazine of predetermined dimensions, backplane dimensions among others, can be extended and increased, at the same time as grouping of all connector fields in the backplane with the connector fields within each group being allocated a consecutive sequence, readily enables grouping of the connector fields for connection to different buses, and therewith create conditions for using alternatively either separate data transmission on two or more buses or affording a redundant function or the possibility of extending the functions.

BRIEF DESCRIPTION OF THE DRAWINGS

A number of exemplifying embodiments of an apparatus or a magazine at present preferred and provided with a backplane adapted for coaction with a number of circuit boards through the medium of a number of connector fields in accordance with the principles of the invention will now be described in more detail with reference to the accompanying drawings, in which FIG. 1 illustrates the coupling principles associated with the earlier known apparatus according to the European patent application recited in the introduction;

FIG. 2 illustrates correspondingly the coupling principle of the present invention as applied to a standardized backplane and while using two buses;

FIG. 3 illustrates the principle coupling of a number of circuit boards having identical or different functions, wherein the available buses for signal transmission are two in number, in accordance with FIG. 2;

DETAILED DESCRIPTION

Figure 4:
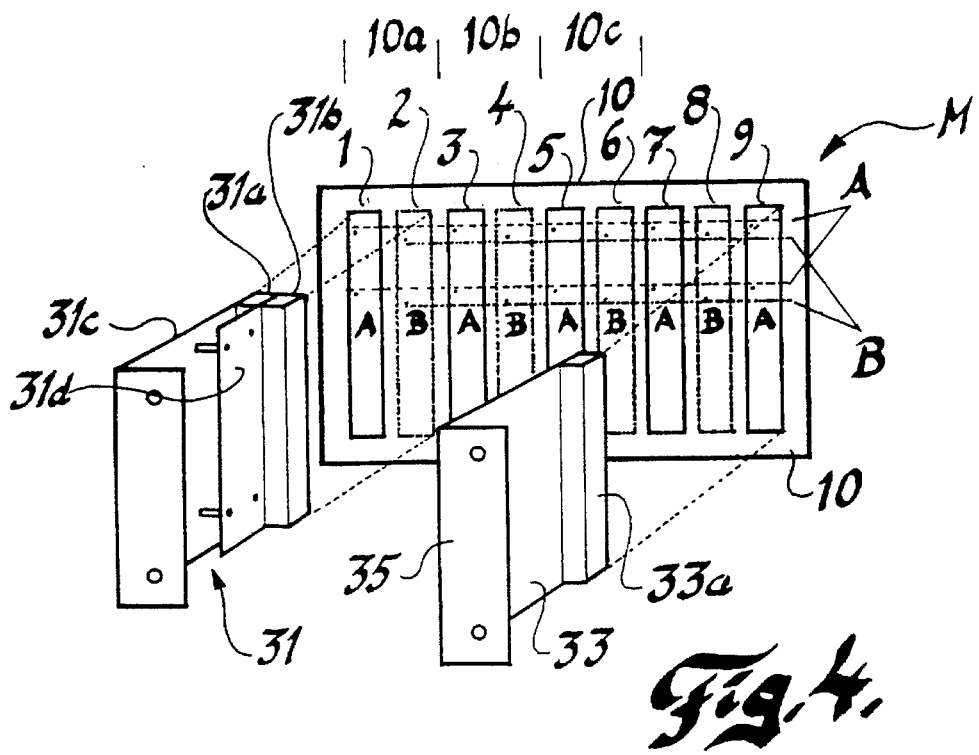
FIG. 4 illustrates very schematically and in perspective application of the invention with two buses, according to FIGS. 2 and 3.

FIG. 1 is a schematic illustration of the apparatus or magazine according to the aforesaid European Patent Application 88111974.7. The apparatus M is shown partly in horizontal view (uppermost) and partly in vertical view (lowermost), with two different circuit boards.

For a better understanding of the features of this known apparatus the reader is referred to the description of the reference publication given at the beginning of the instant document and also to the aforesaid publication as a whole.

Thus, FIG. 1 illustrates a known apparatus or magazine M adapted for coaction at the backplane with a number of circuit boards placed side-by-side, through the medium of connector fields and connectors related thereto.

These circuit boards are known to the art and will not therefore be described in detail. In the illustrated case, the backplane is divided into part-sections, one of which includes the sites SP1–SP5, one includes the sites SP6–SP8, and one includes the sites SP9–SP12, wherein the first connector fields B1 and B2 respectively in each part-section connect with a common bus LP0, whereas remaining connector fields B10 . . . B14 within a part-section all connect with one single second bus LP1.

FIG. 2 is intended to show the application of the invention with a standardized backplane, a "Futurebus +" backplane, supplemented with further connector fields.

A measurement-standardized backplane includes the connector fields 1, 3, 5, and so on, with a given number of connector fields accommodated within a given dimension of the backplane and standardized circuit boards are dimensioned so that each circuit board is able to coact with a connector field, said circuit boards being placed close together.

The invention aims at enabling the number of connector fields to be increased, since it has been found that the standardized distance between the connector fields for bus A is able to accommodate further connector fields intended for another bus B.

All of these further connector fields 2, 4, 6, 8 are commonly connected to a second bus B.

It thus follows that when a backplane is supplemented in this way, standardized circuit boards can be inserted in either to the connector fields 1, 3, 5, and so on, for bus A or in the connector fields 2, 4, 6, and so on, for bus B.

Specially constructed circuit boards can be caused to coact with both the buses A and B through the medium of the connector fields 1, 2; 2, 3; and so on, at the same time.

Primarily standardized circuit boards, but also specifically manufactured circuit boards are each adapted to coact through their respective connector fields and connectors coordinated therein with one of a number of available, mutually adjacent and mutually spaced elongated, narrow connector fields of which some are shown in FIG. 2 and referenced 1–9.

The connectors of each of these elongated connector fields are adapted for firm, but readily removable mechanical and electrical coaction with the connectors of corresponding connector fields related to an edge-part of respective circuit boards.

This coaction is effected in a known manner, by bringing the connector of one connector field into mechanical connection with the connector of a corresponding connector field (each connector socket is caused to coact with a pin connector).

Seen from left to right, all connector fields are allocated a sequence number 1, 2, 3, and so on, this division being important in obtaining an understanding of the inventive features.

According to the invention, the connector fields of the backplane (referenced 10) are placed close together and are arranged in groups where each group is allocated a part-section of the backplane surface. The connector fields 1, 2 within one group are given a consecutive number order.

The inventive concept does not limit the number of groups or the number of connector fields in each group, although there is described in the following an embodiment with two and one with three connector fields in one group.

FIG. 2 illustrates an embodiment in which pairs of backplane connector fields are coordinated in groups 10a, 10b, 10c and 10d.

The connector fields 1 and 2 are coordinated to the group 10a, the connector fields 3 and 4 are coordinated to the group 10b, and so on.

This division results in one extra connector field 9, which may be connected to the bus A as a further circuit board.

In the illustrated case, the groups 10a, 10b, 10c and 10d are distributed uniformly along the backplane, with equal spacing between the connector fields, although it is also conceivable within the scope of the invention to space the groups 10a, 10b, 10c and 10d irregularly along the backplane. It is also possible for one group 10a to be separated from adjacent group 10b by more than the distance between the connector fields within the part-section.

This latter embodiment, however, has the drawback that a circuit board having a plurality of connector fields cannot be moved one connector-field position over to an adjacent group and this circuit board will thus coact exclusively with connector fields within one group.

The invention is based on the number of connector fields within each group being identical and spaced equally apart, so that the circuit boards used can be placed in each desired group.

When using a measurement-standardized backplane equipped with connector fields, designated "Futurebus +", supplemented with intermediate connector fields, it is proposed in accordance with the invention that the number of first selected, measurement-standardized connector fields, are given odd numbers, 1, 3, 5, 7, 9, and that these connector fields coact with a first bus A through the medium of their associated connectors (an upper section), whereas a number of second, selected added connector fields are given even numbers, 2, 4, 6, 8, and coact with a second bus B through the medium of their associated connectors (an upper section).

It should be noted in this regard that the number of even and odd connector fields differ.

The aforesaid two buses A and B may be assigned either redundant functions (meaning that signal patterns can occur simultaneously on both buses, but that only one signal pattern on one bus is used for the signal transmission concerned) or may be adapted for separate functions. (This means that different signal patterns shall occur on the two buses and that the two signal patterns on these buses can be used for different signal transmission.)

As shown in FIGS. 2 and 3, the connector fields 1, 2, 3, 4, 5 and connector fields 8 and 9 are divided into sub-fields, such as a first sub-field 1' and a second sub-field 1", where the sub-field 1' includes connectors intended for the bus A and wherein the sub-field 1" can be used for other information transmission.

The sub-field 2' includes connectors intended for the bus B.

FIG. 2 also illustrates the possibility of allocating a further intermediate part-section to the connector fields 6 and 7, wherein these connector fields may be completely filled with connectors and wherein the intermediate part-sections 6''' and 7''' shall be able to coact with a further bus (not shown).

FIG. 3 is intended to illustrate the use of circuit boards 31 and 32, which are constructed of plates that are oriented in two planes and which have corresponding connector fields 31a, 31b, coordinated to adjacent edge-parts of said two plates. The circuit boards are each adapted for coaction with a respected adjacent connector field, either the connector fields 1, 2 or the connector fields 3, 4, and so on, wherein a circuit board unit can be brought to coaction with the buses A and B or vice versa, i.e. coaction with the connector fields 2, 3 gives coaction with the buses B and A.

The circuit board 32 is constructed in the same way.

The circuit boards 33 and 34, however, are assumed to be standardized circuit boards having one single plate, and consequently the selected position in the connector fields will be decisive as to whether respective circuit boards will coact solely with the bus A or solely with the bus B.

It can be assumed that the circuit board 31 includes a circuit arrangement which operates with redundant buses A and B, and that the circuit board 32 includes a corresponding circuit arrangement while the circuit board 33 or 34 form a circuit arrangement for coaction with one single bus.

The circuit board 31 may coact with the connector fields 1 and 2, the circuit board 32 may coact with the connector fields 3 and 4, and the circuit boards 33 and 34 may coact with the connector fields 5 and 8.

FIG. 4 illustrates a backplane 10 which in addition to the standardized connector fields 1, 3, 5, 7 and 9 also includes further connector fields 2, 4, 6, 8, and illustrates how coaction with the buses A and B is contemplated.

A standardized circuit board 33 which includes a front plate 35 and a connector field 33a can be inserted for coaction with the connector field 9. Such a circuit board 33 is able to coact with each selected connector field 1–9.

FIG. 4 also illustrates the use of a specially constructed circuit board 31.

This circuit board 31 is comprised of two plates 31c and 31d, each orientated in its respective plane, said plates having corresponding connector fields 31a, 31b coordinated with adjacent edge-parts of said two plates 31c and 31d. The two corresponding connector fields 31a, 31b are adapted for simultaneous coaction with one of said connector fields and an adjacent connector field, such as the connector fields 1 and 2, but may also be moved to the alternative 2 and 3, 3 and 4, and so on.

Figure 5:
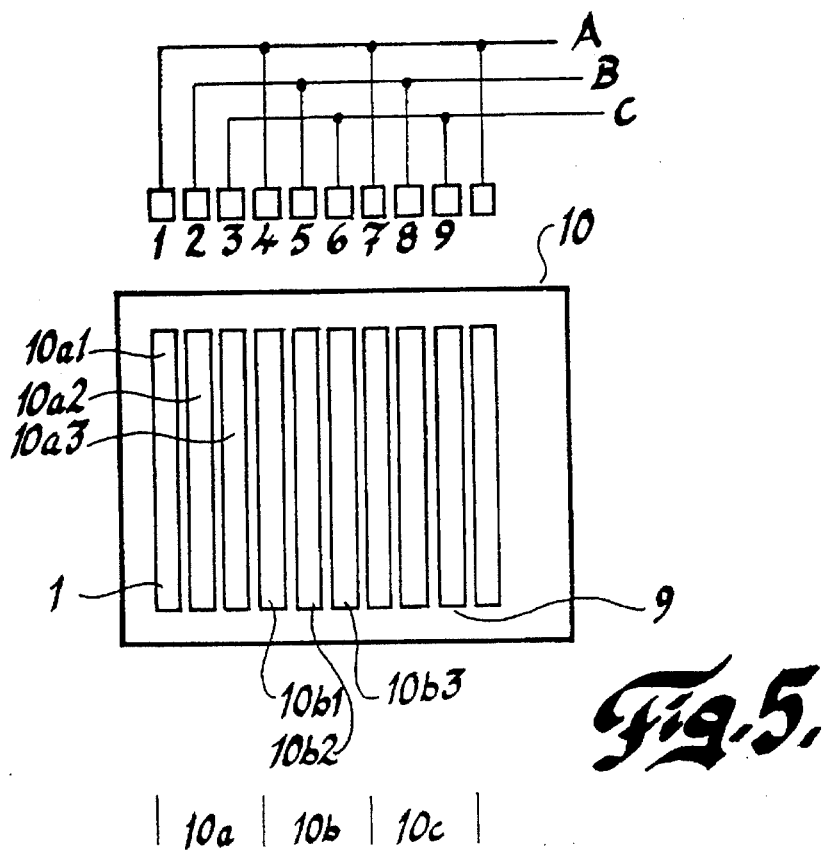
FIG. 5 illustrates possible extension of the number of buses to three and gives a generalized indication of the inventive concept.

FIG. 5 is intended to show that a backplane 10 can be divided into groups 10a, 10b and 10c with three connector fields (1, 2, 3; 4, 5, 6; 7, 8, 9) within each group, and a tenth connector field having only one connector field and connected to the bus A.

The connector fields of each group are given a consecutive number sequence, 10a1, 10a2, 10a3; 10b1, 10b2, 10b3, and so on. The first connector fields (10a1, 10b1) within each respective group are connected to a first bus A, the second connector fields (10a2, 10b2) within each respective group are connected to a second bus B, and the third connector fields (10a3, 10b3) within each respective group are connected to a third bus C, and so on when required.

There is nothing to prevent the various part-sections being marked physically and distinguished, by spacing the connector fields 10a3 and 10b1; 10b3 and 10c1 further apart than the connector fields 10a1, 10a2, 10a3; 10b1, 10b2, 10b3, and so on, within each group 10a, 10b and 10c respectively.

This would result in the drawback mentioned earlier on, however.

It will be understood that each connector field that is not included in a complete group is not considered to have group membership.

It will also be understood that the invention is not restricted to the aforedescribed and illustrated exemplifying embodiments thereof and that modifications can be made within the scope of the inventive concept as defined in the following claims.

I claim:

1. An apparatus having a backplane adapted for coaction with a number of circuit boards arranged in side-by-side relationship and including a number of mutually adjacent and mutually spaced elongated, narrow backplane-related connector fields, each of which is adapted for firm but easily removed mechanical and electrical coaction with a corresponding connector field related to an edge-part of respective circuit boards, wherein a number of first selected backplane-related connector fields are connected electrically to a first bus only, and a number of second selected backplane related connector fields are connected electrically to a second bus only; wherein the backplane-related connector fields are divided into a predetermined number of groups where each group is allotted a part-section of the backplane; and wherein the first selected backplane-related connector fields of respective groups are joined together and connect to the first bus; each group is allocated the same number of connector fields; and respective second selected backplane-related connector fields of respective groups are mutually joined and connected to the second bus.

2. Apparatus according to claim 1, wherein the backplane-related connector fields within one group are three in number.

3. Apparatus according to claim 1, wherein the number of first selected backplane-related connector fields coact over the first bus, the number of second selected backplane-related connector fields coact over the second bus, wherein the buses are allocated redundant functions or separate functions.

4. Apparatus according to claim 1, wherein the number of selected backplane-related connector fields within one group are allocated a predetermined distance; and the distance between the adjacent backplane-related connector fields of a respective group are also allocated said distance.

5. Apparatus according to claim 1, wherein a circuit board is comprised of two or three plates each of which is orientated in a respective lateral plane and which have corresponding connector fields coordinated with adjacent edge-parts of said plates; and the corresponding connector fields are adapted for coaction with backplane-related connector fields arranged in one or two groups.

6. Apparatus according to claim 1, wherein the backplane-related connector fields within one group are two in number, and the first selected backplane-related connector fields are given odd numbers and the second selected backplane-related connector fields are given even numbers in a consecutive number order allocated to all backplane-related connector fields.

7. Apparatus according to claim 6, wherein the number of first selected backplane-related connector fields are spaced apart by a standardized distance, this distance providing an interspace for accommodating a second selected backplane-related connector field and a circuit board.

8. Apparatus according to claim 3, wherein the number of first selected backplane-related connector fields coact over the first bus, the number of second selected backplane-related connector fields coact over the second bus, wherein the buses are allocated redundant functions or separate functions.

9. Apparatus according to claim 3, wherein a circuit board is comprised of two or three plates each of which is orientated in a respective lateral plane and which have corresponding connector fields coordinated with adjacent edge-parts of said plates; and the corresponding connector fields are adapted for coaction with backplane-related connector fields arranged in one or two groups.

10. An apparatus having a backplane adapted for coaction with a number of circuit boards arranged in a side-by-side relationship and including a number of mutually adjacent and mutually spaced elongated, narrow backplane-related connector fields, each of which is adapted for firm but easily removed mechanical and electrical coaction with a corresponding connector field related to an edge-part of respective circuit boards, wherein a number of first selected backplane-related connector fields are connected electrically to a first bus, and a number of second selected backplane related connector fields are connected electrically to a second bus; wherein the backplane-related connector fields are divided into a predetermined number of groups where each group is allotted a part-section of the backplane; and wherein the first selected backplane-related connector fields of respective groups are joined together and connect to the first bus; each group is allocated the same number of connector fields; and respective second selected backplane-related connector fields of respective groups are mutually joined and connected to the second bus, wherein the backplane-related connector fields within one group are two in number, and the first selected backplane-related connector fields are given odd numbers and the second selected backplane-related connector fields are given even numbers in a consecutive number order allocated to all backplane-related connector fields, and wherein the number of first selected backplane-related connector fields coact over the first bus, the number of second selected backplane-related connector fields coact over the second bus, wherein the buses are allocated redundant functions or separate functions; and wherein the number of backplane-related connector fields with one group are allocated a predetermined distance; and the distance between the adjacent backplane-related connector fields of a respective group are also allocated said distance; wherein the number of first selected backplane-related connector fields are spaced apart by a standardized distance, this distance providing an interspace for accommodating a second selected backplane-related connector field and circuit board; wherein a circuit board is comprised of two or three plates each of which is oriented in a respective lateral plane and which have corresponding connector fields coordinated with adjacent edge-parts of said plates; and the corresponding connector fields are adapted for coaction with backplane-related connector fields arranged in one or two groups.

* * * * *